United States Patent
Inukai (10) Patent No.: US 8,912,468 B2
(45) Date of Patent: Dec. 16, 2014

(54) ZERO-CROSSING DETECTOR CIRCUIT AND IMAGE FORMING APPARATUS HAVING THE SAME

(75) Inventor: Katsumi Inukai, Iwakura (JP)

(73) Assignee: Brother Kogyo Kabushiki Kaisha, Nagoya-Shi, Aichi-Ken (JP)

(*) Notice: Subject to any disclaimer, the term of this patent is extended or adjusted under 35 U.S.C. 154(b) by 192 days.

(21) Appl. No.: 13/560,201

(22) Filed: Jul. 27, 2012

(65) Prior Publication Data

US 2013/0028623 A1    Jan. 31, 2013

(30) Foreign Application Priority Data

Jul. 28, 2011  (JP) ................. 2011-165512

(51) Int. Cl.
*H05B 1/02* (2006.01)
*G01R 19/175* (2006.01)
*H02M 1/08* (2006.01)
*H02M 7/219* (2006.01)

(52) U.S. Cl.
CPC ...... *G01R 19/175* (2013.01); *H02M 2007/2195* (2013.01); *Y02B 70/1408* (2013.01); *H02M 1/083* (2013.01)
USPC ............ 219/492; 219/501; 219/508; 323/235

(58) Field of Classification Search
CPC .... H05B 1/02; H05B 1/02412; H05B 1/0202; C03G 15/0266; C03G 15/2039; C03G 15/205; C03G 15/2053; C03G 15/003; C03G 15/054; G05F 3/04; G01R 19/175
USPC ............. 219/492, 494, 497, 501, 505, 508; 323/319, 235, 236
See application file for complete search history.

(56) References Cited

U.S. PATENT DOCUMENTS 3,270,272 A    8/1966  Kurimura
5,568,398 A *  10/1996 Trainor ................. 700/298
(Continued)

FOREIGN PATENT DOCUMENTS

CN    2864700 Y    1/2007
CN    201110615 Y  9/2008
(Continued)

OTHER PUBLICATIONS

Japan Patent Office, Notification of Reasons for Refusal for Japanese Patent Application No. 2011-165512 (counterpart to above-captioned patent application), mailed Aug. 20, 2013.

(Continued)

*Primary Examiner* — Mark Paschall
(74) *Attorney, Agent, or Firm* — Merchant & Gould PC (57) ABSTRACT

A zero-crossing detector circuit includes: a first capacitor including a first electrode configured to connect to one end of an AC power supply and a second electrode; a second capacitor including a first electrode configured to connect to the other end of the AC power supply and a second electrode; a current path, which is connected in series between the second electrode of the first capacitor and the second electrode of the second capacitor, and which is connected to a reference potential, and which generates a second-electrode-side voltage when the AC current passes through the current path; a signal converting circuit, which is connected to the AC power supply to receive the second-electrode-side voltage and then converts the second-electrode-side voltage into a pulse signal; and a detecting unit, which detects a pulse period of the pulse signal, which and detects zero-crossing points by using the pulse period.

9 Claims, 10 Drawing Sheets

(56) References Cited

U.S. PATENT DOCUMENTS

| | | | |
|---|---|---|---|
| 6,259,073 B1 * | 7/2001 | Inukai | 219/497 |
| 7,091,706 B2 * | 8/2006 | Pierson | 323/237 |
| 2004/0190923 A1 | 9/2004 | Inukai | |
| 2010/0045346 A1 | 2/2010 | Yoshida | |

FOREIGN PATENT DOCUMENTS

| | | |
|---|---|---|
| CN | 101465608 A | 6/2009 |
| CN | 101738535 A | 6/2010 |
| DE | 3915649 A1 | 11/1990 |
| DE | 10 2005 030634 A1 | 1/2007 |
| GB | 1007892 A | 10/1965 |
| JP | S54-044859 A | 4/1979 |
| JP | S63-102325 U | 7/1988 |
| JP | H02-284214 A | 11/1990 |
| JP | H04-051083 U | 4/1992 |
| JP | H08-056259 A | 2/1996 |
| JP | 2000-064396 A | 2/2000 |
| JP | 2004-151998 A | 5/2004 |
| JP | 2004-303469 A | 10/2004 |
| JP | 2010-054306 A | 3/2010 |
| JP | 2010-239774 A | 10/2010 |
| RU | 2133039 C1 | 7/1999 |
| WO | 2007/003459 A1 | 1/2007 |

OTHER PUBLICATIONS

Japan Patent Office, Decision of Rejection for Japanese Patent Application No. 2011-165512 (counterpart to above-captioned patent application), mailed Nov. 5, 2013.

R.W. Wall, "Simple Methods for Detecting Zero Crossing", The 29th Annual Conference of the IEEE Industrial Electronics Society, 2003. IECON '03, IEEE Service Center, Piscataway, NJ, vol. 3, Nov. 2, 2003, pp. 2477-2481.

Extended European Search Report issued in EP 12177218.0, May 30, 2014.

Chinese Office Action issued in CN 2014051300987290, May 16, 2014.

* cited by examiner

ZERO-CROSSING DETECTOR CIRCUIT AND IMAGE FORMING APPARATUS HAVING THE SAME

CROSS-REFERENCE TO RELATED APPLICATION

This application claims priority from Japanese Patent Application No. 2011-165512 filed on Jul. 28, 2011, the entire subject matter of which is incorporated herein by reference.

TECHNICAL FIELD

This disclosure relates to a zero-crossing detector circuit and an image forming apparatus having the zero-crossing detector circuit, and more specifically, to a technology to detect zero-crossing points of an AC voltage.

BACKGROUND

As a technology to detect zero-crossing points (zero-crossing timings) of an AC voltage, there has been known a technology disclosed in JP-A-2010-239774, for example. JP-A-2010-239774 discloses a technology to detect zero-crossing points using a photocoupler.

However, according to a method of detecting zero-crossing points using a photocoupler as in JP-A-2010-239774, it is possible to appropriately detect zero-crossing points, but the power consumption of a photodiode of the photocoupler is not negligible. For this reason, a technology to detect zero-crossing points which can save electric power has been desired.

SUMMARY

This disclosure provides at least a technology to detect zero-crossing points which can save electric power.

With taking into consideration the above, a zero-crossing detector circuit of this disclosure comprises a first capacitor, a second capacitor, a current path, a signal converting circuit, and a detecting unit. The first capacitor includes a first electrode configured to connect to one end of an AC power supply and a second electrode. The second capacitor includes a first electrode configured to connect to the other end of the AC power supply and a second electrode. The current path, which is connected in series between the second electrode of the first capacitor and the second electrode of the second capacitor, and which is connected to a reference potential, and the current path causes an AC current output from the AC power supply to pass through the current path when the AC current returns to the AC power supply, and generates a second-electrode-side voltage when the AC current passes through the current path. The signal converting circuit, which is connected to the AC power supply to receive the second-electrode-side voltage and then converts the second-electrode-side voltage into a pulse signal. The detecting unit, which detects a pulse period of the pulse signal, which and detects zero-crossing points of an AC voltage of the AC power supply by using the pulse period.

Further, an image forming apparatus of this disclosure may comprise the above-described zero-crossing detector circuit. The above-described image forming apparatus may comprising a fixing device, on which heating control is performed on the basis of the zero-crossing points detected by the detecting unit of the zero-crossing detector circuit.

According to this disclosure, instead of a photocoupler, the first capacitor, the second capacitor, the current path, and the signal converter circuit are used to generate a pulse signal for detecting zero-crossing points (zero-crossing timings). Therefore, for example, in a case where the signal converter circuit is configured by a transistor, and the current path is configured by a diode and a resistor, it is possible to reduce a current flowing in the current path, as compared to a drive current of the photocoupler. As a result, it is possible to save electric power, as compared to a case where a photocoupler is used to generate a pulse signal for detecting zero-crossings.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Figure 1:
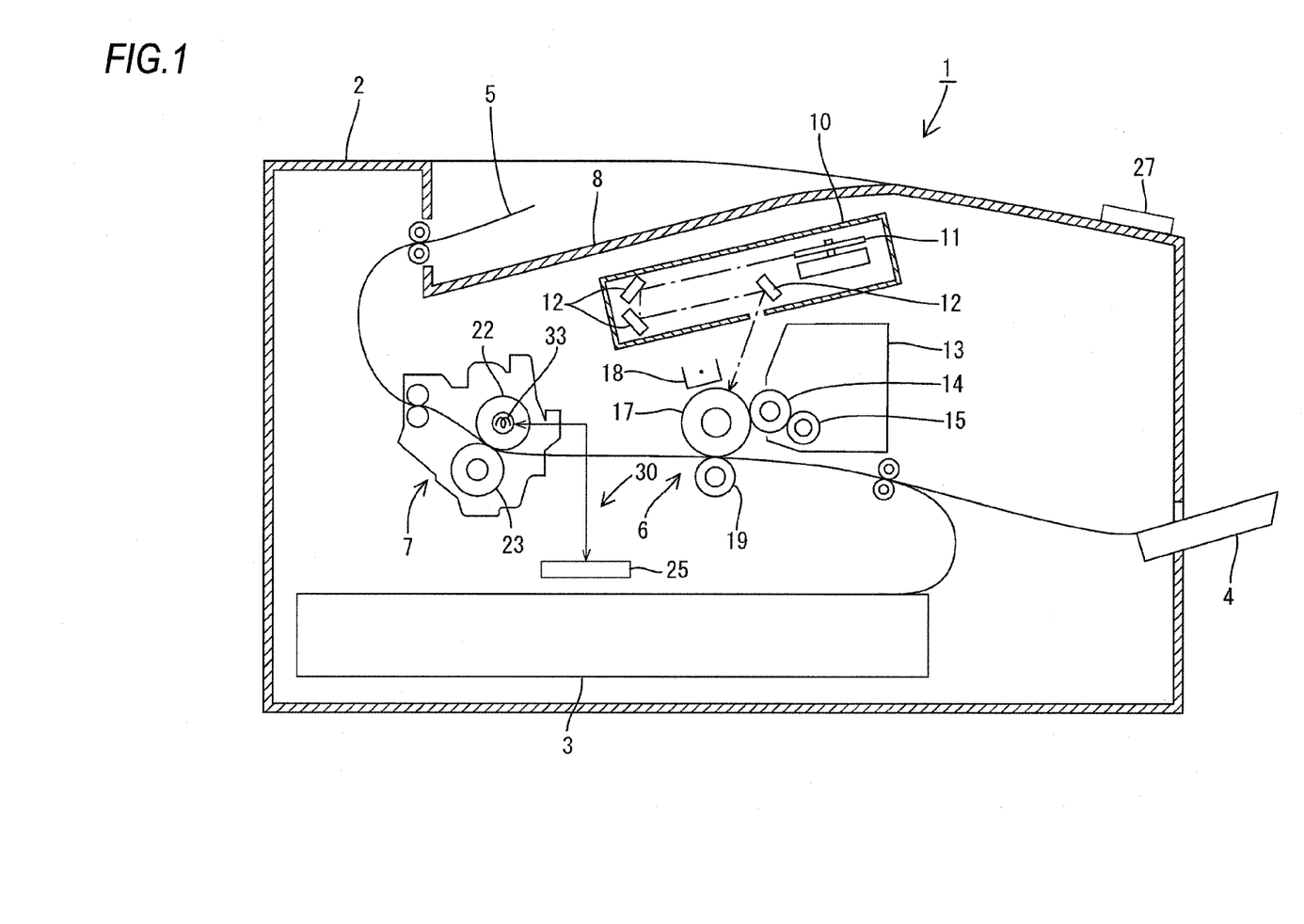
FIG. 1 is a sectional side view illustrating a schematic configuration of an image forming apparatus according to a first embodiment.
Figure 2:
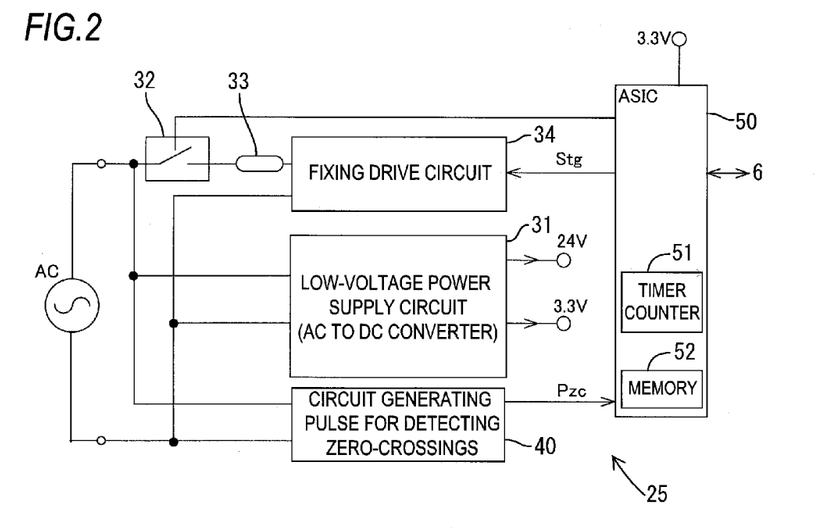
FIG. 2 is a block diagram illustrating a schematic configuration of a circuit relative to driving of a fixing unit.

<First Embodiment>
A first embodiment will be described with reference to FIGS. 1 to 7.
1. Configuration of Laser Printer
FIG. 1 is a view schematically illustrating a vertical section of a monochrome laser printer 1 which is an example of an image forming apparatus according to the first embodiment. FIG. 2 is a block diagram illustrating a schematic configuration of a circuit board 25 relative to driving of a fixing unit 7. The image forming apparatus is not limited to the monochrome laser printer and may be, for example, a color laser printer, a color LED printer, a multi-function apparatus, and the like.

In the monochrome laser printer (hereinafter, referred to simply as 'a printer') 1, an image forming unit 6 forms a toner image on a sheet 5 supplied from a tray 3 disposed at a lower portion or a tray 4 disposed on a side surface of a main body casing 2, a fixing unit 7 performs a fixing process by heating the toner image, and thus the sheet 5 is discharged to a discharge tray 8 positioned at an upper portion in the main body casing 2.

The image forming unit 6 includes a scanner unit 10, a development cartridge 13, a photosensitive drum 17, a charger 18, and a transfer roller 19.

The scanner unit 10 is disposed at the upper portion in the main body casing 2, and the scanner unit 10 includes a laser emission unit (not shown), a polygon mirror 11, a plurality of reflective mirrors 12, a plurality of lenses (not shown), and the like. In the scanner unit 10, a laser beam emitted the laser emission unit is irradiated onto a surface of the photosensitive drum 17 through the polygon mirror 41, the reflective mirrors 12, and the lenses, as shown by an alternate long and short dash line, so that high-speed scanning is performed.

The development cartridge 13 has toner accumulated therein. At a toner feed opening of the development cartridge 13, a developing roller 14 and a feeding roller 15 are provided to face each other, and the developing roller 14 is disposed to face the photosensitive drum 17. The toner in the development cartridge 13 is fed to the developing roller 14 by rotation of the feeding roller 15, to be held on the developing roller 14.

The charger 18 is disposed above the photosensitive drum 17 with a gap. Further, the transfer roller 19 is disposed below the photosensitive drum 17 to face the photosensitive drum 17.

The surface of the photosensitive drum 17 is first uniformly charged to, for example, a positive polarity, by the charger 18 while rotating. Next, an electrostatic latent image is formed on the photosensitive drum 17 by the laser beam from the scanner unit 10. Thereafter, if the photosensitive drum 17 comes into contact with the developing roller 14 and rotates, the toner held on the developing roller 14 is fed to the electrostatic latent image on the surface of the photosensitive drum 17 and is held on the surface of the photosensitive drum 17 such that a toner image is formed. Thereafter, when a sheet 5 passes between the photosensitive drum 17 and the transfer roller 19, the toner image is transferred onto the sheet 5 by a transfer bias applied to the transfer roller 19.

The fixing unit (which is an example of a fixing device) 7 is disposed on the downstream side of the image forming unit 6 in a sheet conveyance direction, and the fixing unit 7 includes a fixing roller 22, a pressing roller 23 for pressing the fixing roller 22, a halogen heater 33 for heating the fixing roller 22, and the like. The halogen heater 33 is connected to a circuit board 25, and the halogen heater 33 is electrically controlled by a signal from the circuit board 25.

The circuit board 25 includes a low-voltage power supply circuit (an AC-DC converter) 31, a fixing relay 32, a fixing drive circuit 34, a circuit 40 for generating a pulse for detecting zero-crossings, and an application specific integrated circuit (ASIC) 50 (see FIG. 2).

For example, the low-voltage power supply circuit 31 converts an AC voltage of 100V into DC voltages of 24 V and 3.3 V, and the low-voltage power supply circuit 31 supplies the DC voltages to individual units. The halogen heater 33 generates heat according to energization of an AC power supply AC.

The fixing relay 32 is provided between the AC power supply AC and the halogen heater 33, and connects or disconnect the AC power supply AC to or from the halogen heater 33.

The fixing drive circuit 34 includes, for example, a TRIAC, and controls a conduction angle of the TRIAC on the basis of a trigger pulse signal Stg supplied from the ASIC 50, so that the halogen heater 33 is driven.

Figure 5:
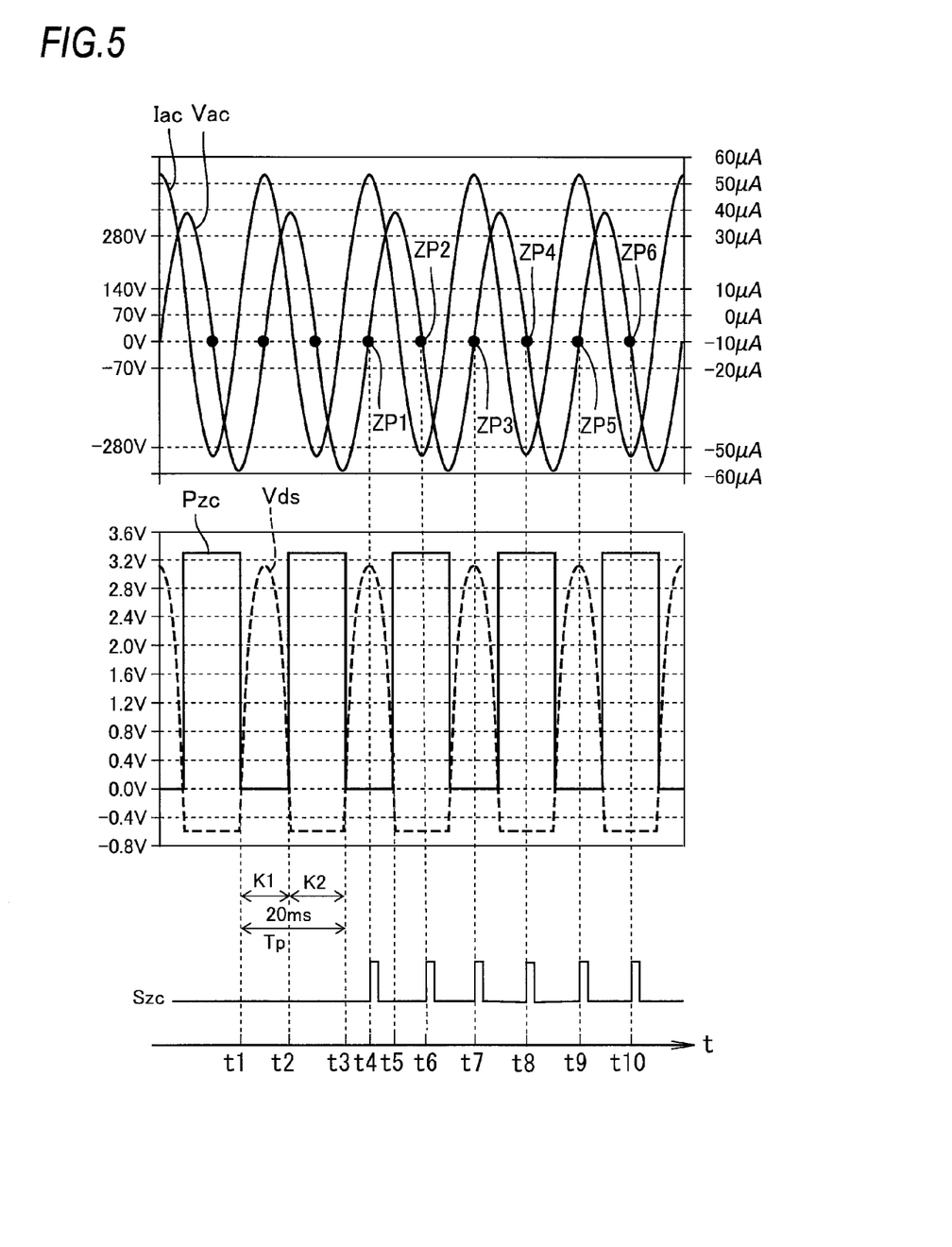
FIG. 5 is a timing chart illustrating various signals according to the first embodiment.

The ASIC 50 includes a timer counter 51, a memory 52, and the like, and detects zero-crossing points ZP of an AC voltage Vac of the AC power supply AC (see FIG. 5). Further, the ASIC 50 generates a zero-crossing signal Szc on the basis of the zero-crossing points ZP (see FIG. 5), and the ASIC 50 generates the trigger pulse signal Stg on the basis of the zero-crossing signal Szc. The ASIC 50 supplies the trigger pulse signal Stg to the fixing drive circuit 34, such that energization of the fixing unit 7 is controlled. In addition, the ASIC 50 performs various controls regarding image formation.

The timer counter 51 is used for time measurement when the zero-crossing points ZP is detected. The memory 52 includes a ROM and a RAM. The ROM stores various programs to be executed by the ASIC 50, and the RAM stores various kinds of data when a program is executed.

2. Configuration of Zero-Crossing Detector Circuit

Figure 3:
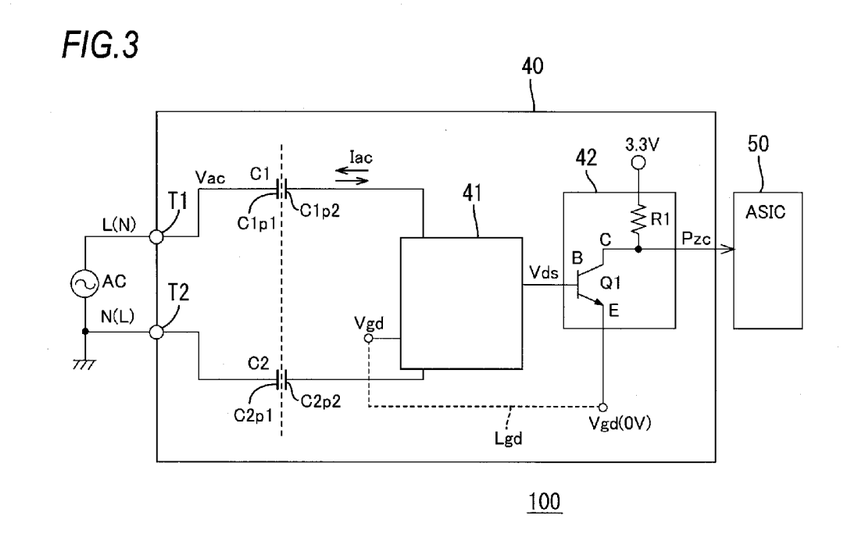
FIG. 3 is a block diagram illustrating a basic configuration of a zero-crossing detector circuit.

Next, a zero-crossing detector circuit 100 provided to the printer 1 will be described with reference to FIGS. 3 to 7. FIG. 3 is a block diagram illustrating a basic circuit configuration of the zero-crossing detector circuit 100.

The zero-crossing detector circuit 100 is configured by the circuit 40 for generating a pulse for detecting zero-crossings, and the ASIC 50. The zero-crossing detector circuit 100 is provided to the printer 1, and but this disclosure is not limited thereto. Further, the ASIC 50 is an example of a detecting unit, and but the detecting unit is not limited to the ASIC 50. For example, the detecting unit may be configured by a CPU or a separate logic circuit.

The circuit 40 for generating a pulse for detecting zero-crossings (hereinafter, referred to simply as 'a pulse generating circuit 40') includes a first capacitor C1, a second capacitor C2, a current path 41, and a signal converting circuit 42, as shown in FIG. 3.

The first capacitor C1 includes a first electrode C1p1 and a second electrode C1p2, the first electrode C1p1 is connected to one end of the AC power supply AC, and the second electrode C1p2 is connected to the current path 41. As shown as an example in FIG. 3, the first electrode C1p1 of the first capacitor C1 is connected to a live-side power line L of the AC power supply AC which is one end of the AC power supply AC.

The second capacitor C2 includes a first electrode C2p1 and the second electrode C2p2, the first electrode C2p1 is connected to the other end of the AC power supply AC, and the second electrode C2p2 is connected to the current path 41. As shown as an example in FIG. 3, the first electrode C2p1 of the second capacitor C2 is connected to a neutral-side power line N of the AC power supply AC which is the other end of the AC power supply AC. The neutral-side power line N is grounded.

The current path 41 is connected in series between the second electrode C1p2 of the first capacitor C1 and the second electrode C2p2 of the second capacitor C2, and the current path 41 generates a second-electrode-side voltage with causing an AC current Iac output from the AC power supply AC to pass through the current path 41 when the AC current Iac returns to the AC power supply AC. Further, the current path 41 is connected to the signal converting circuit 42 and a reference potential line Lgd. Here, a reference potential Vgd is set to 0 V (zero V).

The signal converting circuit 42 is connected to the current path 41, and converts the second-electrode-side voltage Vds generated by the AC current Iac flowing between the second electrode C1p2 of the first capacitor C1 and the second electrode C2p2 of the second capacitor C2, into a pulse signal for detecting zero-crossings Pzc (hereinafter, referred to simply as a pulse signal).

The signal converting circuit 42 includes a transistor Q1 and a resistor R1, as shown as an example in FIG. 3. Here, the transistor Q1 is used as a switching transistor which performs a switching operation according to a base voltage VB. Each embodiment illustrates a case where the transistor Q1 is an NPN transistor. However, the transistor Q1 is not limited to a NPN transistor. Also, the configuration of the signal converting circuit 42 for converting the second-electrode-side voltage Vds into the pulse signal Pzc is not necessarily limited to the configuration of the transistor Q1 and the resistor R1.

The NPN transistor (hereinafter, referred to simply as 'a transistor') Q1 includes a collector C connected to one end of the resistor R1, a base B connected to the current path 41, and an emitter E connected to the reference potential line Lgd. The resistor R1 is a pull-up resistor, and the other end of the resistor R1 is connected to a DC power supply DC of 3.3 V.

The transistor Q1 is turned on or off according to the base voltage VB supplied to the base B. Further, the pulse signal Pzc is output from the collector C of the transistor Q1, and that becomes 0 V when the transistor Q1 is on and becomes 3.3 V when the transistor Q1 is off.

The ASIC 50 detects a pulse period Tp of the pulse signal Pzc, and the ASIC 50 detects the zero-crossing points ZP of the AC voltage Vac of the AC power supply AC by using the pulse period Tp (see FIG. 5).

As described above, in the zero-crossing detector circuit 100, instead of a photocoupler, the first capacitor C1, the second capacitor C2, the current path 41, and the signal converting circuit 42 are used to generate the pulse signal Pzc for detecting zero-crossing points (zero-crossing timings) ZP. Therefore, for example, if the signal converting circuit 42 is configured by the transistor Q1 and the current path 41 is configured by a diode and a resistor, it is possible to reduce the current flowing in the current path 41, as compared to a drive current of a photocoupler. As a result, it becomes possible to save the power as compared to a case that a photocoupler is used to generate a pulse signal for detecting zero-crossings.

3. Zero-Crossing Detector Circuit

Hereinafter, a zero-crossing detector circuit 100A according to the first embodiment will be described with reference to FIGS. 4 to 7.

Figure 4:
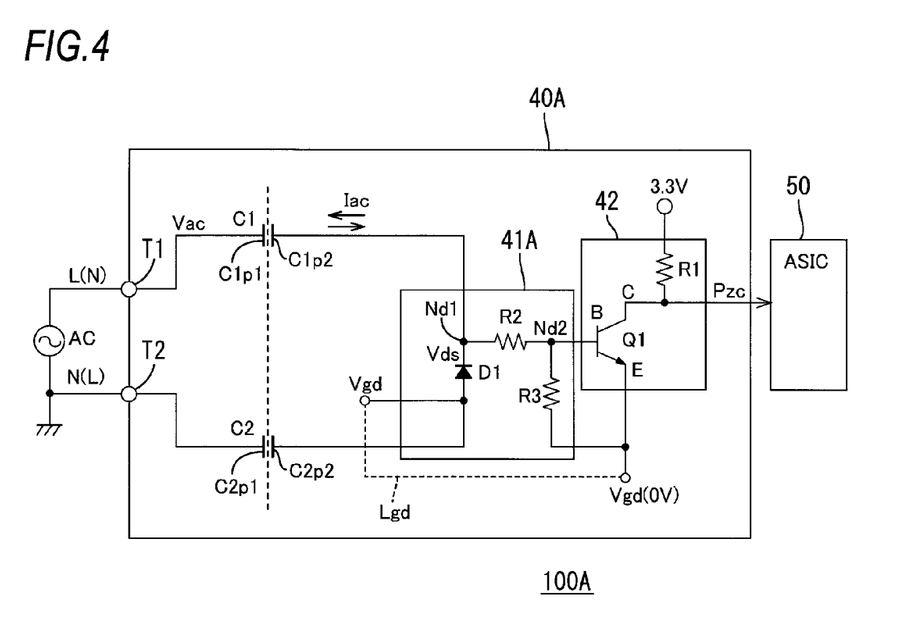
FIG. 4 is a block diagram illustrating a configuration of a zero-crossing detector circuit according to the first embodiment.

FIG. 4 shows a configuration of the zero-crossing detector circuit 100A of the first embodiment. As shown in an example in FIG. 4, the live-side power line L of the AC power supply AC is connected to a power supply terminal T1 of a pulse generating circuit 40A, and the neutral-side power line N of the AC power supply AC is connected to a power supply terminal T2 of the pulse generating circuit 40A. The neutral-side power line N is grounded. Further, in the first embodiment, the printer 1 is not connected to a frame ground, and the reference potential line Lgd of the zero-crossing detector circuit 100 having a reference potential Vgd (0V) is not grounded.

Further, a current path 41A of the first embodiment includes a diode D1 and resistors R2 and R3. An anode of the diode D1 is connected to the second electrode C2p2 of the second capacitor C2, and a cathode of the diode D1 is connected to the second electrode C1p2 of the first capacitor C1. The diode D1 suppresses a negative voltage (reverse bias) from being applied to the transistor Q1. The diode D1 is an example of a first reverse-voltage suppressing element.

Furthermore, one end of the resistor R2 is connected to the cathode of the diode D1, and one end of the resistor R3 is connected to the reference potential line Lgd. A second contact node Nd2 between the resistor R2 and the resistor R3 is connected to the base B of the transistor Q1. Here, the resistor R2 and the resistor R3 form a current path, and the resistor R2 has a function of adjusting a base current of the transistor Q1.

In this case, in a half period when the AC current Iac is positive (hereinafter, referred to simply as 'a positive cycle'), the AC current Iac from the AC power supply AC flows into the first capacitor C1, the resistor R2, the resistor R3, the reference potential line Lgd, and the second capacitor C2 in this order and then returns to the AC power supply AC. A portion of the AC current Iac also flows between the base and emitter of the transistor Q1.

Meanwhile, in a half period when the AC current Iac is negative (hereinafter, referred to simply as 'a negative cycle), the AC current Iac from the AC power supply AC flows into the second capacitor C2, the diode D1, and the first capacitor C1 in this order and then returns to the AC power supply AC.

FIG. 5 is a timing chart illustrating the waveforms of an AC input voltage Vac, the AC current Iac, a voltage Vds at a first contact node Nd1, and the pulse signal Pzc in the first embodiment. The phase of the AC current Iac is earlier than the phase of the AC input voltage Vac by 90 degrees due to the load of the capacitors. Further, the voltage Vds (hereinafter, referred to as 'a first-contact-node voltage Vds') at the first contact node Nd1, which is a contact node between the cathode of the diode D1 and the resistor R2, corresponds to the second-electrode-side voltage. The phase of the first-contact-node voltage Vds is the same as the phase of the AC current Iac.

4. First Method of Detecting Zero-crossing Points

Next, a method of detecting zero-crossing points according to the first embodiment will be described with reference to FIG. 5.

As shown in FIG. 5, if the first-contact-node voltage Vds exceeds almost 0.6 V at a time t1 of FIG. 5, a voltage between the base and the emitter exceeds an on-voltage, so that the transistor Q1 is turned on and the pulse signal Pzc becomes 0 V. After the time t1, the voltage Vds rises and then falls. If the voltage Vds becomes almost 0.6 V at a time t2, the transistor Q1 is turned off and thus the pulse signal Pzc becomes almost 3.3 V.

If the pulse signal Pzc becomes 0 V at the time t1 of FIG. 5, the timer counter 51 of the ASIC 50 starts measuring a period K1 (from the time t1 to the time t2) when the pulse signal Pzc is 0 V. Here, the period K1 corresponds to a positive cycle of the AC current Iac.

Further, if the pulse signal Pzc becomes 3.3 V at the time t2 of FIG. 5, the timer counter 51 starts measuring a period K2 (from the time t2 to a time t3) in which the pulse signal Pzc is 3.3 V. Here, the period K2 corresponds to a negative cycle of the AC current Iac. Here, the sum of the period K1 and the period K2, that is, a period from the time t1 to the time t3 corresponds to the pulse period Tp of the pulse signal Pzc, and the timer counter 51 detects the pulse period Tp of the pulse signal Pzc. Next, the ASIC 50 detects a zero-crossing point ZP1 on the basis of the pulse period Tp of the pulse signal Pzc. In the first embodiment, the pulse period Tp becomes 20 ms (milliseconds).

In a case where the pulse period Tp (=K1+K2) is greater than 13 ms, the ASIC 50 calculates a time t4 of the zero-crossing point ZP1 shown in FIG. 5 by the following Equation 1.

$$t4=t3+(K1/2) \qquad \text{Equation 1}$$

Further, the ASIC 50 calculates a time t6 of a zero-crossing point ZP2 shown in FIG. 5 by the following Equation 2.

$$t6=t5+(K2/2) \qquad \text{Equation 2}$$

Here, the times t1 and t3 of FIG. 5 are falling timings of the pulse signal Pzc, and the times t2 and t5 of FIG. 5 are rising timings of the pulse signal Pzc. Therefore, in other words, in a case where the pulse period Tp of the pulse signal Pzc is greater than 13 ms which is a predetermined period, the ASIC 50 detects the zero-crossing points ZP on the basis of the rising timings and falling timings of the pulse signal Pzc.

In the same way, the ASIC 50 calculates times t7 to t10 of zero-crossing points ZP3 to ZP6. Next, the ASIC 50 generates the zero-crossing signal Szc which rises at the times t4, and t6 to t10 of the zero-crossing points ZP1 to ZP6, for example, and electrically controls of the fixing unit 7 on the basis of the zero-crossing signal Szc. Specifically, the ASIC 50 generates the trigger pulse signal Stg on the basis of the zero-crossing signal Szc and supplies the trigger pulse signal Stg to the fixing drive circuit 34.

In the first embodiment, the frequency of the AC power supply AC is set to 50 Hz, and the effective value of the AC input voltage Vac is set to 240 V. Further, the capacitances of the first capacitor C1 and the second capacitor C2 are set to 1000 pF (pico-farads), a forward voltage drop of the diode D1 is set to 0.6 V, the resistance value of the resistor R2 is set to 47 kΩ, and the resistance value of the resistor R3 is set to 220 kΩ. In this case, the power consumption is about 60 μW, which is significantly less than several hundreds mW in a case of using a photocoupler. This has been confirmed by experiments.

A case, where the neutral-side power line N of the AC power supply AC is connected to the power supply terminal T1 of the pulse generating circuit 40 and the live-side power line L of the AC power supply AC is connected to the power supply terminal T2, will be described below. In this case, in a positive cycle, the AC current Iac from the AC power supply AC flows into the second capacitor C2, the diode D1, and the first capacitor C1 in this order and then returns to the AC power supply AC.

Meanwhile, in a negative cycle, the AC current Iac from the AC power supply AC flows into the first capacitor C1, the resistor R2, the resistor R3, the reference potential line Lgd, and the second capacitor C2 in this order and then returns to the AC power supply AC. A portion of the AC current Iac also flows between the base and emitter of the transistor Q1. In other words, in this case, in a negative cycle, the transistor Q1 is off, and thus the zero-crossing points ZP are calculated in the same way by Equations 1 and 2.

(Effects of First Embodiment)

As described above, in the first embodiment, the current path 41A for generating the first-contact-node voltage Vds to turn on or off the transistor Q1 of the signal converting circuit 42 according to the zero-crossing points ZP of the AC voltage Vac can be formed by a very simple configuration by the diode D1 and the resistors R2 and R3. Further, since the current path 41A uses a significantly smaller amount of current than a circuit for driving a photocoupler does, it is possible to significantly reduce the power consumption of the zero-crossing detector circuit 100, as compared to a case of using a photocoupler to generate the pulse signal Pzc.

In the first embodiment, any one of the diode D1 and the resistor R2 may be omitted. In short, the configuration of the current path 41 needs only to have a configuration in which current paths are formed in both of a positive cycle and a negative cycle, and it is possible to generate the pulse signal Pzc in at least one cycle of the positive cycle and the negative cycle.

Figure 6:
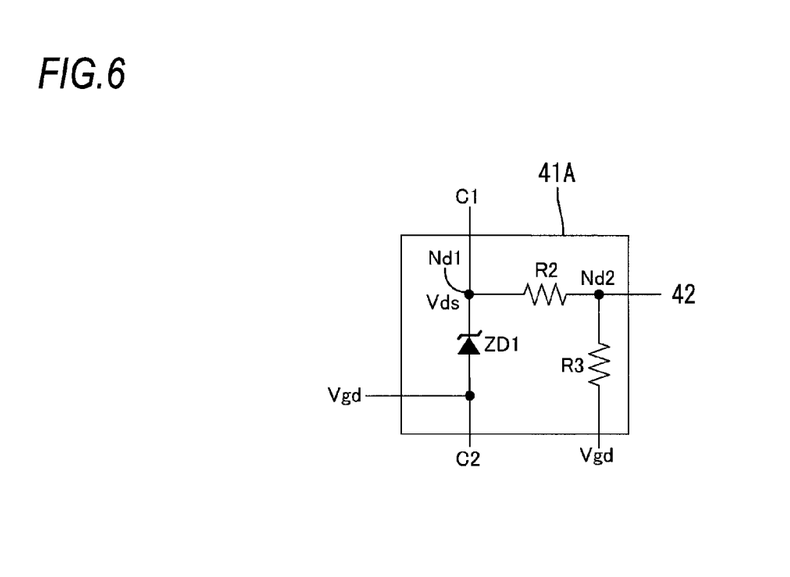
FIG. 6 is a circuit diagram illustrating another example of a current path according to the first embodiment.

Also, in the first embodiment, the diode D1 which is the first reverse-voltage suppressing element may be replaced with a zener diode ZD1 as shown in FIG. 6. In this case, even in a case where the AC voltage changes, the AC input voltage, that is, the second-electrode-side voltage of the first capacitor is suppressed from excessively rising.

Figure 7:
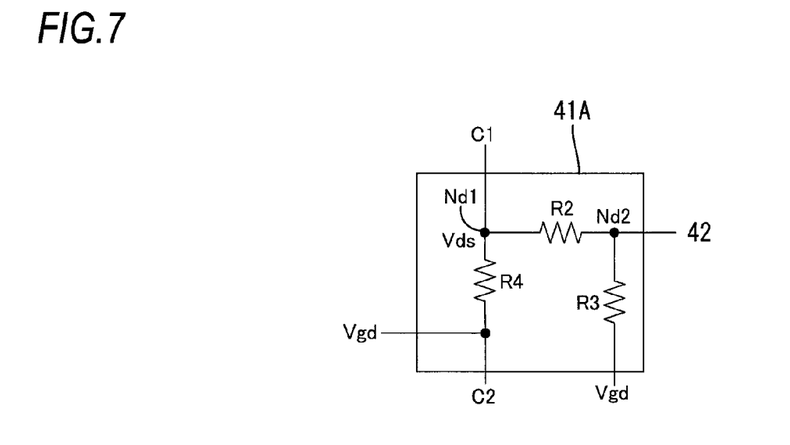
FIG. 7 is a circuit diagram illustrating another example of the current path according to the first embodiment.

Alternatively, the diode D1 which is the first reverse-voltage suppressing element may be replaced with a resistor R4 as shown in FIG. 7. Also, the diode D1 may be omitted. Even in this case, if the capacitances of the first capacitor C1 and the second capacitor C2 are appropriately selected, it is possible to significantly reduce the power consumption, as compared to a case of using a photocoupler.

Instead of the diode D1, a capacitor or a varistor may be used.

<Second Embodiment>

Figure 8:
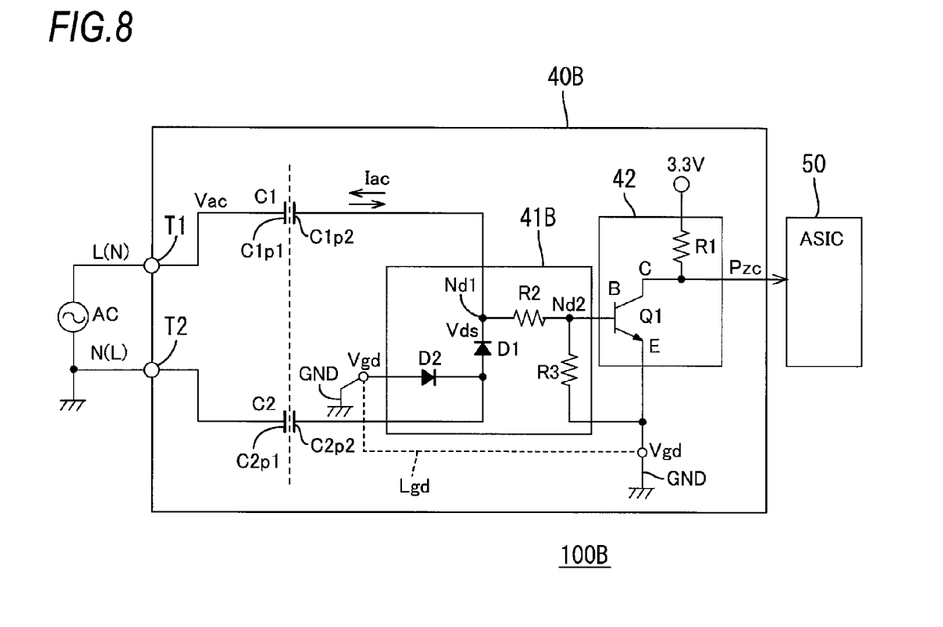
FIG. 8 is a block diagram illustrating a configuration of a zero-crossing detector circuit according to a second embodiment.

Next, a second embodiment of the zero-crossing detector circuit 100 will be described with reference to FIGS. 8 to 10. FIG. 8 illustrates a configuration of a zero-crossing detector circuit 100B according to the second embodiment. The second embodiment is different from the first embodiment mainly in a configuration of a current path 41B of a pulse generating circuit 40B, and thus this difference will be mainly described. Identical components are denoted by the same reference symbols and will not be described.

The current path 41B of the zero-crossing detector circuit 100B of the second embodiment is different from the current path 41A of the first embodiment in that the current path 41B includes a diode D2. As shown in FIG. 8, a cathode of the diode D2 is connected to the anode of the diode D1, and an anode of the diode D2 is connected to a ground line GND.

FIG. 8 shows a case where the frame of the printer 1 is connected to a frame ground, and the reference potential Vgd (the reference potential line Lgd) is grounded through the ground line GND. Further, as shown as an example in FIG. 8, the live-side power line L of the AC power supply AC is connected to the power supply terminal T1, and the neutral-side power line N of the AC power supply AC is connected to the power supply terminal T2.

In this case, in a positive cycle, the AC current Iac from the AC power supply AC flows into the first capacitor C1, the resistor R2, the resistor R3, and the ground line GND in this order and then returns to the AC power supply AC. A portion of the AC current Iac also flows between the base and emitter of the transistor Q1.

Meanwhile, in a negative cycle, the AC current Iac from the AC power supply AC flows into the ground line GND, the diode D2, the diode D1, and the first capacitor C1 in this order and then returns to the AC power supply AC.

In a case where the neutral-side power line N is connected to the power supply terminal T1 and the live-side power line L is connected to the power supply terminal T2, in a positive cycle, the AC current Iac from the AC power supply AC flows into the second capacitor C2, the diode D1, the resistor R2, the resistor R3, and the ground line GND in this order and then returns to the AC power supply AC. A portion of the AC current Iac also flows between the base and emitter of the transistor Q1 through the resistor R2.

Meanwhile, in a negative cycle, the AC current Iac from the AC power supply AC flows into the ground line GND, the diode D2, and the second capacitor C2 in this order and then returns to the AC power supply AC.

Additionally, in a case where the printer 1 is not connected to a frame ground and the reference potential Vgd is not grounded, the AC current Iac flows almost in the same way as that in the first embodiment.

Further, similarly to the first embodiment, detecting zero-crossing points is performed using a half period of a positive cycle when the AC current Iac flows between the base and emitter of the transistor Q1. In other words, the zero-crossing points are detected using Equations 1 and 2.

Even in the second embodiment, similarly to the first embodiment, the frequency of the AC power supply AC is set to 50 Hz, and the effective value of the AC input voltage Vac is set to 240 V. Further, the capacitances of the first capacitor C1 and the second capacitor C2 are set to 1000 pF, each of forward voltage drops of the diodes D1 and D2 are set to 0.6 V, the resistance value of the resistor R2 is set to 47 kΩ, and the resistance value of the resistor R3 is set to 220 kΩ. In this case, the power consumption is about 60 μW, which is significantly less than that in a case of using a photocoupler. This has been confirmed by experiments.

(Effects of Second Embodiment)

As descried above, in the second embodiment, since the diode D2 which is a second reverse-voltage suppressing element is provided, it is possible to detect the zero-crossing points with saving power, without depending on whether the printer 1 is connected to a frame ground and on a power supply connection method.

Figure 9:
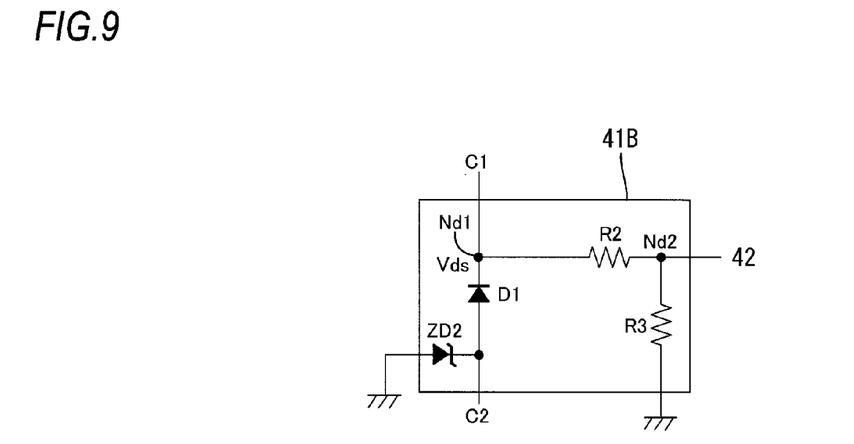
FIG. 9 is a circuit diagram illustrating another example of a current path according to the second embodiment.

In the second embodiment, the diode D2 which is the second reverse-voltage suppressing element may be replaced with a zener diode ZD2 as shown in FIG. 9. Even in this case, it is possible to detect the zero-crossing points with low power, without depending on whether the printer 1 is connected to a frame ground and on a power supply connection method.

Figure 10:
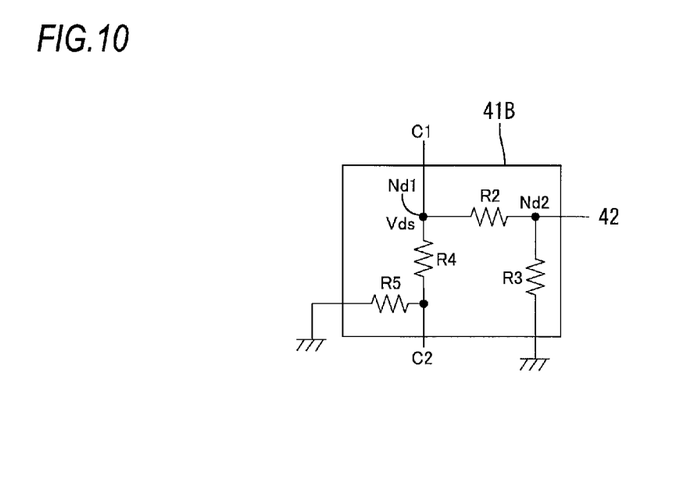
FIG. 10 is a circuit diagram illustrating another example of the current path according to the second embodiment.

Also, the diode D1 and the diode D2 which are the first reverse-voltage suppressing element and the second reverse-voltage suppressing element may be replaced with the resistor R4 and a resistor R5 as shown in FIG. 10. Even in this case, if the printer 1 is connected to a frame ground, it is possible to detect the zero-crossing points with saving power, without a power supply connection method.

<Third Embodiment>

Figure 11:
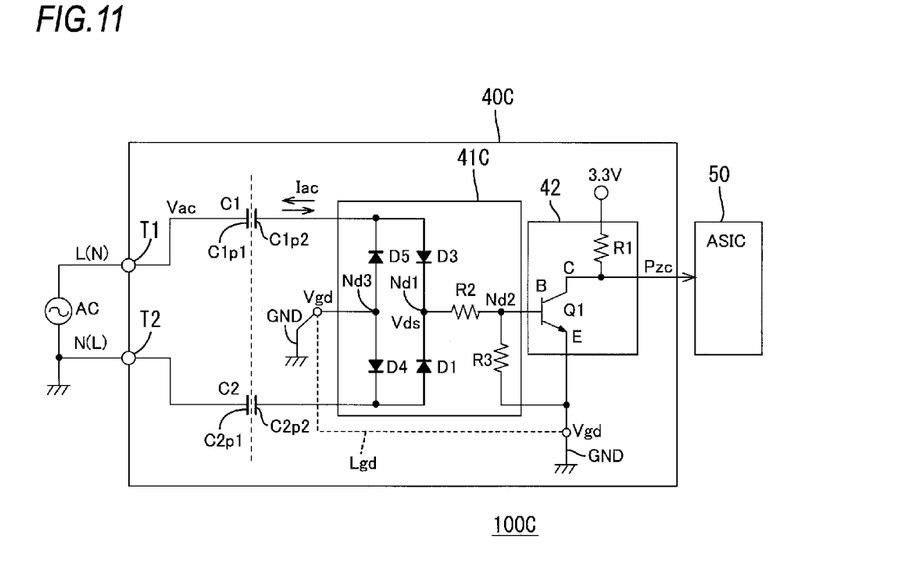
FIG. 11 is a block diagram illustrating a configuration of a zero-crossing detector circuit according to a third embodiment.

Next, a third embodiment of the zero-crossing detector circuit 100 will be described with reference to FIGS. 11 to 16. FIG. 11 illustrates a configuration of a zero-crossing detector circuit 100C according to the third embodiment. The third embodiment is different from the first embodiment mainly in a configuration of a current path 41C of a pulse generating circuit 40C, and thus this difference will be mainly described. Identical components are denoted by the same reference symbols and will not be described.

The current path 41C of the zero-crossing detector circuit 100C of the third embodiment is different from that of the first embodiment in that the current path 41B includes a bridge circuit as a component for generating the first-contact-node voltage Vds. As shown in FIG. 11, the bridge circuit is configured by four diodes D1, D3, D4, and D5. Cathodes of the diode D1 and the diode D3 are connected at the first contact node Nd1, a cathode of the diode D1 is connected to the second electrode C2p2 of the second capacitor C2, and an anode of the diode D3 is connected to the second electrode C1p2 of the first capacitor C1.

Further, both of anodes of the diode D4 and the diode D5 are connected at a third contact node Nd3, a cathode of the diode D4 is connected to the second electrode C2p2 of the second capacitor C2, and a cathode of the diode D5 is connected to the second electrode C1p2 of the first capacitor C1. The third contact node Nd3 is grounded through the ground line GND.

In this case, a series circuit of the diodes D4 and D5 and a series circuit of the diodes D1 and D3 constitute a pair of series circuits each of which includes two circuit elements. The first contact node Nd1 and the third contact node Nd3 correspond to the contact nodes of the circuit elements.

FIG. 11 illustrates a case where the printer 1 is connected to a frame ground, and the reference potential Vgd (reference potential line Lgd) is grounded through the ground line GND. Further, the live-side power line L of the AC power supply AC is connected to the power supply terminal T1, and the neutral-side power line N of the AC power supply AC is connected to the power supply terminal T2.

In this case, in a positive cycle, the AC current Iac from the AC power supply AC flows into the first capacitor C1, the diode D3, the resistor R2, the resistor R3, and the ground line GND in this order and then returns to the AC power supply AC. A portion of the AC current Iac also flows between the base and emitter of the transistor Q1.

Meanwhile, in a negative cycle, the AC current Iac from the AC power supply AC flows into the ground line GND, the diode D5, and the first capacitor C1 in this order and then returns to the AC power supply AC.

In a case where the neutral-side power line N is connected to the power supply terminal T1 and the live-side power line L is connected to the power supply terminal T2, in a positive cycle, the AC current Iac from the AC power supply AC flows into the second capacitor C2, the diode D1, the resistors R2 and R3, and the ground line GND in this order and then returns to the AC power supply AC. A portion of the AC current Iac also flows between the base and emitter of the transistor Q1 through the resistor R2.

Meanwhile, in a negative cycle, the AC current Iac from the AC power supply AC flows into the ground line GND, the diode D4, and the second capacitor C2 in this order and then returns to the AC power supply AC.

In these cases, that is, in the case where the printer 1 is connected to a frame ground, similarly to the first embodiment, detecting zero-crossing points is performed using a half period of a positive cycle when the AC current Iac flows between the base and emitter of the transistor Q1. In other words, the zero-crossing points are detected using Equations 1 and 2.

A case, where the printer 1 is not connected to a frame ground and the ground line GND is not grounded, will be described below.

In the case where the live-side power line L of the AC power supply AC is connected to the power supply terminal T1 and the neutral-side power line N of the AC power supply AC is connected to the power supply terminal T2, in a positive cycle, the AC current Iac from the AC power supply AC flows into the first capacitor C1, the diode D3, the resistor R2, the resistor R3, the reference potential line Lgd, the diode D4, and the second capacitor C2 in this order and then returns to the AC power supply AC. A portion of the AC current Iac also flows between the base and emitter of the transistor Q1.

Meanwhile, in a negative cycle, the AC current Iac from the AC power supply AC flows into the second capacitor C2, the diode D1, the resistor R2, the resistor R3, the reference potential line Lgd, the diode D5, and the first capacitor C1 in this order and then returns to the AC power supply AC. A portion of the AC current Iac also flows between the base and emitter of the transistor Q1.

Even in the case where the neutral-side power line N of the AC power supply AC is connected to the power supply terminal T1, and the live-side power line L is connected to the power supply terminal T2, the current paths in a positive cycle and a negative cycle are just reversed, and similarly, the AC current Iac flows between the base and emitter of the transistor Q1 in both the positive cycle and the negative cycle.

In other words, in the case where the printer 1 is not connected to a frame ground, in both a positive cycle and a negative cycle, the current flows between the base and emitter of the transistor Q1. A method of detecting zero-crossing points in that case will be described below.

5. Second Method of Detecting Zero-Crossing Points

Figure 12:
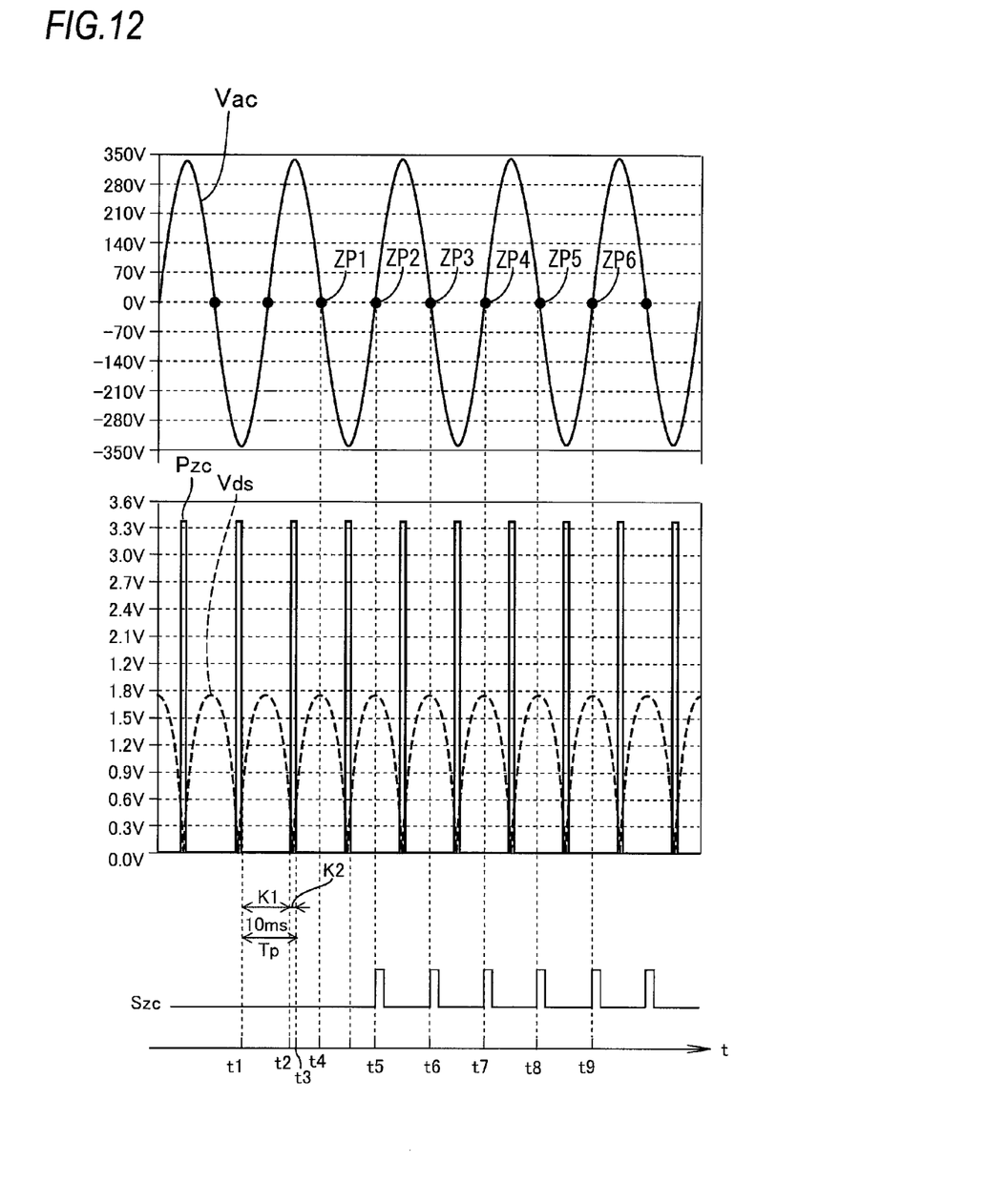
FIG. 12 is a timing chart illustrating various signals according to the third embodiment.

FIG. 12 is a timing chart illustrating the waveforms of the AC input voltage Vac, the first-contact-node voltage Vds, the pulse signal Pzc, and the zero-crossing signal Szc in the case where the printer 1 is not connected to a frame ground, in the third embodiment.

If the first-contact-node voltage Vds exceeds almost 0.6 V at a time t1 of FIG. 12 and if the transistor Q1 is turned on and thus the pulse signal Pzc becomes 0 V, the timer counter 51 of the ASIC 50 starts measuring a period K1 (from the time t1 to the time t2) when the pulse signal Pzc is 0 V. Next, if the first-contact-node voltage Vds becomes lower than almost 0.6 V at a time t2 of FIG. 12 and if the transistor Q1 is turned off and thus the pulse signal Pzc rises to 3.3 V, the timer counter 51 starts measuring a period K2 (from the time t2 to a time t3) when the pulse signal Pzc is 3.3 V. Here, the sum of the period K1 and the period K2, that is, a period from the time t1 to the time t3 corresponds to the pulse period Tp of the pulse signal Pzc, and the timer counter 51 detects the pulse period Tp of the pulse signal Pzc. In the third embodiment, the pulse period Tp becomes 10 ms (milliseconds).

In a case where the pulse period Tp (=K1+K2) is less than 13 ms, the ASIC 50 calculates a time t4 of a zero-crossing point ZP1 shown in FIG. 12 by the following Equation 1.

$$t4=t3+(K1/2) \qquad \text{Equation 1}$$

In other words, the ASIC 50 detects the zero-crossing point ZP1 on the basis of the pulse period Tp of the pulse signal Pzc.

Similarly, the ASIC 50 calculates a time t6 of a zero-crossing point ZP2 by the following Equation.

$$t6=t5+(K1/2)$$

In the same way, the ASIC 50 calculates times t7 to t10 of zero-crossing points ZP3 to ZP6. Next, the ASIC 50 generates the zero-crossing signal Szc which rises at the times t4, and t6 to t10 of the zero-crossing points ZP1 to ZP6, and electrically controls of the fixing unit 7 on the basis of the zero-crossing signal Szc.

In other words, in the third embodiment, in the case where the printer 1 is not connected to a frame ground, since the first-contact-node voltage Vds has a full-wave rectified waveform, it is possible to calculate the times of the zero-crossing points ZP using only Equation 1. The times t1 and t3 of FIG. 12 are falling timings of the pulse signal Pzc. Therefore, in other words, in a case where the pulse period Tp of the pulse signal Pzc is equal to or less than 13 ms which is the predetermined period, the ASIC 50 detects the zero-crossing points ZP on the basis of the falling timings of the pulse signal Pzc. Also, it is possible to detect the zero-crossing points ZP on the basis of the rising timings of the pulse signal Pzc.

In the third embodiment, the frequency of the AC power supply AC is set to 50 Hz, and the effective value of the AC input voltage Vac is set to 240 V. Further, the capacitances of the first capacitor C1 and the second capacitor C2 are set to 470 pF, each of forward voltage drops of the diodes D1 to D4 are set to 0.6 V, the resistance value of the resistor R2 is set to 47 kΩ, and the resistance value of the resistor R3 is set to 220 kΩ. In this case, the power consumption is about 60 μW when the printer 1 is connected to a frame ground, and the power consumption is about 45 μW when the printer 1 is not connected to a frame ground. Therefore, the power consumption is significantly less than that in a case of using a photocoupler. This has been confirmed by experiments.

(Effects of Third Embodiment)

It is possible to reduce the power consumption, and since the bridge circuit is configured, it is possible to appropriately detect the zero-crossing points, without depending on whether the printer 1 is connected to a frame ground and on a power supply connection method.

Further, according to the length of the pulse period Tp of the pulse signal Pzc, it is possible to determine whether the printer 1 has been connected to a frame ground, that is, whether the reference potential Vgd has been grounded or not. Specifically, if the frequency of the AC power supply AC is set to 50 Hz, in the case where the printer 1 is connected to a frame ground, the pulse period Tp becomes 20 ms. On the other hands, in the case where the printer 1 is not connected to a frame ground, the pulse period Tp becomes 10 ms. According to the difference in the pulse period Tp, it is possible to determine whether the printer 1 has been connected to a frame ground. If it is determined that the printer 1 has not been connected to a frame ground, for example, it is possible to use a display unit 27 to urge a user of the printer 1 to connect the printer 1 to a frame ground.

Figure 13:
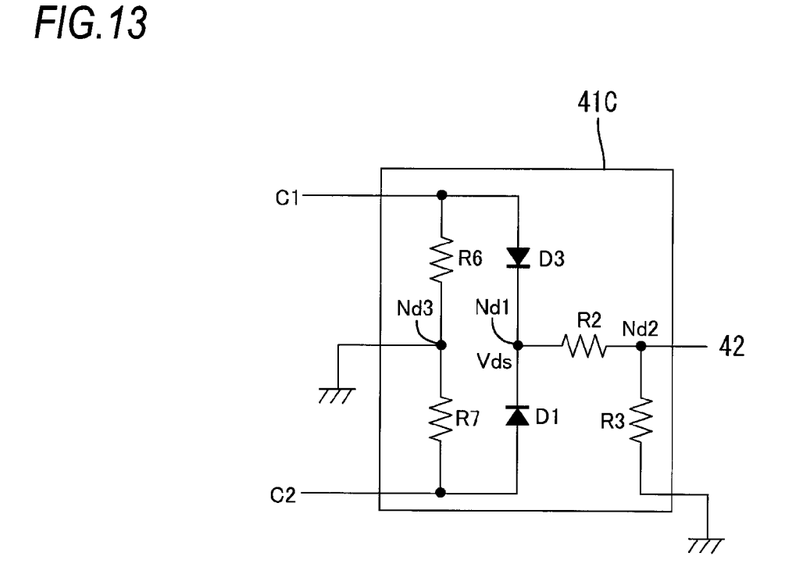
FIG. 13 is a circuit diagram illustrating another example of a current path according to the third embodiment.
Figure 14:
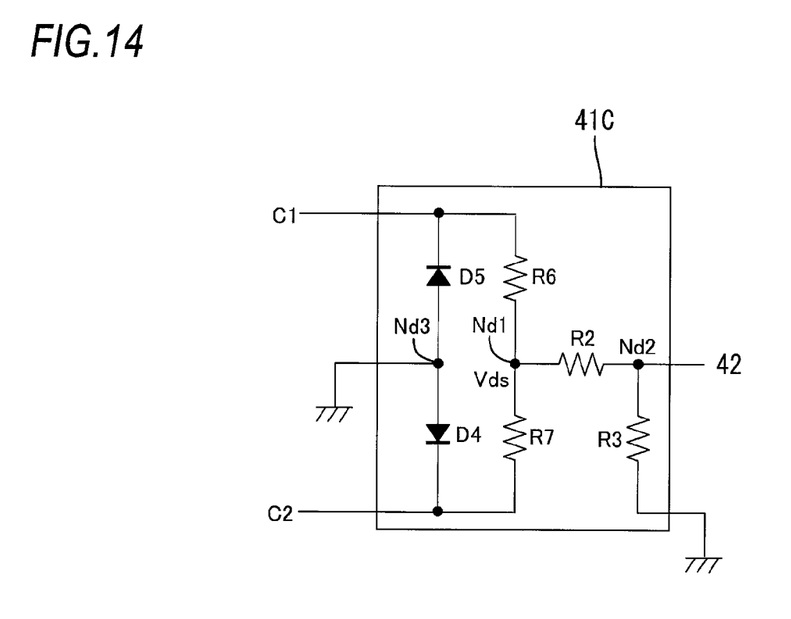
FIG. 14 is a circuit diagram illustrating another example of the current path according to the third embodiment.
Figure 15:
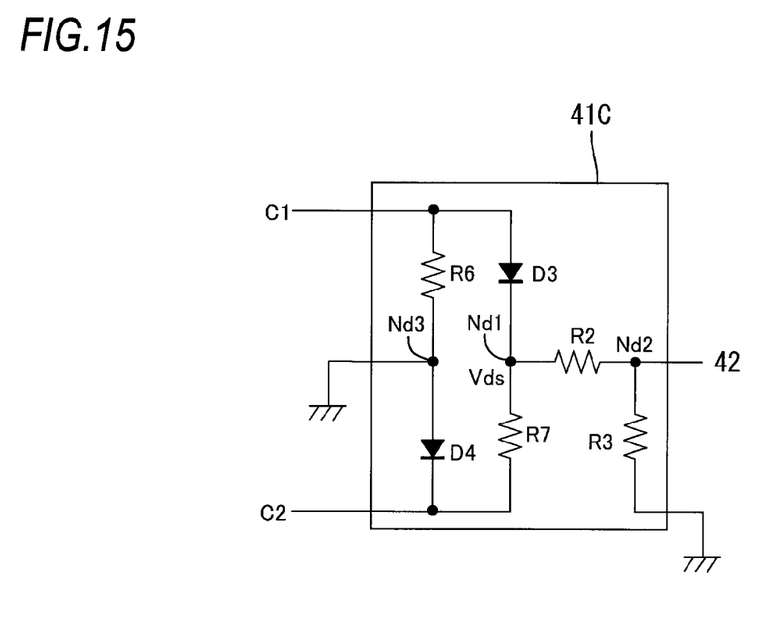
FIG. 15 is a circuit diagram illustrating another example of the current path according to the third embodiment.
Figure 16:
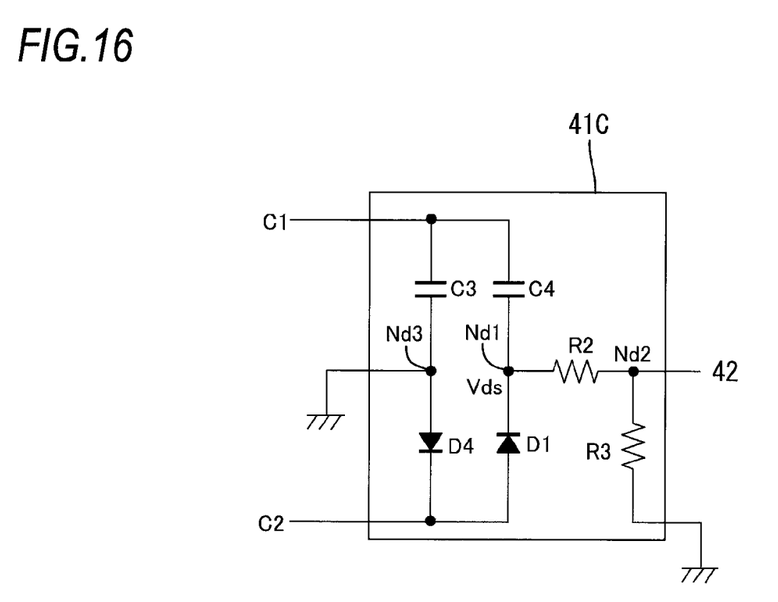
FIG. 16 is a circuit diagram illustrating another example of the current path according to the third embodiment.

In the third embodiment, the diode D5 and the diode D4 of the current path 41C may be replaced with a resistor R6 and a resistor R7 as shown in FIG. 13. Also, the diode D3 and the diode D1 of the current path 41C may be replaced with the resistor R6 and the resistor R7 as shown in FIG. 14. Further, the diode D5 and the diode D1 of the current path 41C may be replaced with the resistor R6 and the resistor R7 as shown in FIG. 15. Furthermore, the diode D5 and the diode D3 of the current path 41C may be replaced with a capacitor-resistor C3 and a capacitor C4 as shown in FIG. 16.

In short, the bridge circuit needs only to be configured so that, in the case where the printer 1 is not connected to a frame ground, the AC input voltage Vac is full-wave rectified at the first contact node Nd1, that is, the waveform of the first-contact-node voltage Vds becomes a full-wave rectified waveform.

<Other Embodiments>

This disclosure is not limited to the embodiments described with reference to the drawings, and but the following embodiments, for example, are included in the technical scope of this disclosure.

In each of the above-mentioned embodiments, the resistor R2 and the resistor R3 are used for generating a base voltage for the transistor Q1. However, this disclosure is not limited thereto, but the resistor R2 and the resistor R3 may be omitted. In other words, the base B of the transistor Q1 may be connected directly to the first contact node Nd1.

What is claimed is:

1. A zero-crossing detector circuit comprising:
   a first capacitor including a first electrode configured to connect to one end of an AC power supply and a second electrode;
   a second capacitor including a first electrode configured to connect to the other end of the AC power supply and a second electrode;
   a current path, which is connected in series between the second electrode of the first capacitor and the second electrode of the second capacitor, and which is connected to a reference potential, and wherein the current path causes an AC current output from the AC power supply to pass through the current path when the AC current returns to the AC power supply, and generates a second-electrode-side voltage when the AC current passes through the current path;

a signal converting circuit, which is connected to the AC power supply to receive the second-electrode-side voltage and then converts the second-electrode-side voltage into a pulse signal; and a detecting unit, which detects the presence of a pulse period of the pulse signal and detects zero-crossing points of an AC voltage of the AC power supply by using the pulse signal.

2. The zero-crossing detector circuit according to claim 1, wherein the signal converting circuit includes a transistor, and wherein the current path includes a first reverse-voltage suppressing element to suppress a reverse voltage from being applied to the transistor.

3. The zero-crossing detector circuit according to claim 2, wherein the current path further includes a second reverse-voltage suppressing element provided between the first reverse-voltage suppressing element and the reference potential.

4. The zero-crossing detector circuit according to claim 1, wherein the first reverse-voltage suppressing element is a diode, wherein a cathode of the diode is connected to the second electrode of the first capacitor, and wherein an anode of the diode is connected to the second electrode of the second capacitor.

5. The zero-crossing detector circuit according to claim 1, wherein the current path includes a bridge circuit that is configured by a pair of series circuits, each of which includes two circuit elements, wherein a contact node between the circuit elements of one of the pair of series circuits of the bridge circuit is connected to the reference potential, and wherein a contact node between the circuit elements of the other of the pair of series circuits is connected to the signal converting circuit.

6. The zero-crossing detector circuit according to claim 5, wherein, in a case where the pulse period of the pulse signal is greater than a predetermined period, the detecting unit detects the zero-crossing points on the basis of rising timings of the pulse signal and falling timings of the pulse signal, and wherein, in a case where the pulse period of the pulse signal is equal to or less than the predetermined period, the detecting unit detects the zero-crossing points on the basis of either the rising timings of the pulse signal or the falling timings of the pulse signal.

7. The zero-crossing detector circuit according to claim 5, wherein, in a case where the pulse period of the pulse signal is greater than a predetermined period, the detecting unit detects that the reference potential is grounded, and wherein, in a case where the pulse period of the pulse signal is equal to or less than the predetermined period, the detecting unit detects that the reference potential is grounded.

8. An image forming apparatus comprising the zero-crossing detector circuit according to claim 1.

9. The image forming apparatus according to claim 8, further comprising:

a fixing device, on which heating control is performed on the basis of the zero-crossing points detected by the detecting unit of the zero-crossing detector circuit.

* * * * *